(12) United States Patent
Froehlich et al.

(10) Patent No.: US 8,897,460 B2
(45) Date of Patent: Nov. 25, 2014

(54) MICROPHONE AMPLIFIER

(75) Inventors: Thomas Froehlich, Wattwil (CH);
Wolfgang Duenser, Rapperswil-Jona (CH)

(73) Assignee: AMS AG, Unterpremstätten (AT)

( * ) Notice: Subject to any disclaimer, the term of this patent is extended or adjusted under 35 U.S.C. 154(b) by 345 days.

(21) Appl. No.: 13/330,285

(22) Filed: Dec. 19, 2011

(65) Prior Publication Data
US 2012/0155675 A1 Jun. 21, 2012

(30) Foreign Application Priority Data

Dec. 17, 2010 (DE) .................. 10 2010 054 895

(51) Int. Cl.
 H04R 3/00 (2006.01)
 H03F 1/52 (2006.01)
 H03F 3/187 (2006.01)
(52) U.S. Cl.
 CPC ............... *H03F 3/187* (2013.01); *H03F 1/523* (2013.01); *H03F 2200/78* (2013.01); *H03F 2200/03* (2013.01)
 USPC ............. 381/92; 381/120; 381/122; 381/123; 381/323
(58) Field of Classification Search
 CPC ............ H03F 2200/12; H03F 2200/15; H03F 2200/18; H03F 2200/186; H03F 2200/189; H03F 2200/21; H03F 2200/24; H03F 2200/27; H03F 2200/519; H03F 2200/522; H03F 2200/525; H03F 2200/21127; H03F 2200/21131; H03F 2203/30015; H03F 2200/03; H03F 3/68; H03F 3/181; H03F 3/217; H03F 3/2171; H03F 3/2173; H03F 3/2175; H03F 3/2176; H03F 3/2178; H03F 3/72; H03F 13/00; H04R 5/04; H04R 3/00; H04R 3/04; H04R 3/06; H04R 19/016; H04R 19/04; H04R 1/04; H04S 1/002; H03G 2201/40
 USPC .......... 381/26, 314, 323, 92, 94.5, 94.6, 94.9, 381/95, 111, 112, 113, 114, 115, 120, 122; 330/73, 96, 123, 127, 130, 136, 148, 330/199
 See application file for complete search history.

(56) References Cited

U.S. PATENT DOCUMENTS

| | | | |
|---|---|---|---|
| 4,541,112 A | 9/1985 | Kern | |
| 6,266,423 B1 | 7/2001 | Werrbach | |
| 2006/0062406 A1* | 3/2006 | Kinoshita | 381/113 |
| 2007/0160234 A1* | 7/2007 | Deruginsky et al. | 381/113 |
| 2011/0026731 A1* | 2/2011 | Wu et al. | 381/92 |

FOREIGN PATENT DOCUMENTS

| | | |
|---|---|---|
| EP | 0 096 778 | 5/1983 |
| WO | WO 2007/108929 | 9/2007 |

* cited by examiner

*Primary Examiner* — Leshui Zhang
(74) *Attorney, Agent, or Firm* — McDermott Will & Emery LLP

(57) ABSTRACT

A microphone amplifier comprises an input terminal (E100) for applying an input signal (IN), an output terminal (A100a) for outputting an output signal (OUT), and an additional output terminal (A100b) for outputting an additional output signal (VBIAS). The microphone amplifier also contains an amplifying circuit (10) for generating the output signal (OUT) by amplifying the input signal (IN), wherein the amplifying circuit (10) is connected between the input terminal (E100) and the output terminal (A100a), and a voltage generator (30) for generating the additional output signal (VBIAS). A supply voltage terminal (V30) of the voltage generator (30) is connected to the output terminal (A100a) of the microphone amplifier. Since the amplifying circuit (10) makes available a supply voltage (V) for the voltage generator (30), the microphone amplifier can be operated without a separate supply voltage terminal.

15 Claims, 4 Drawing Sheets

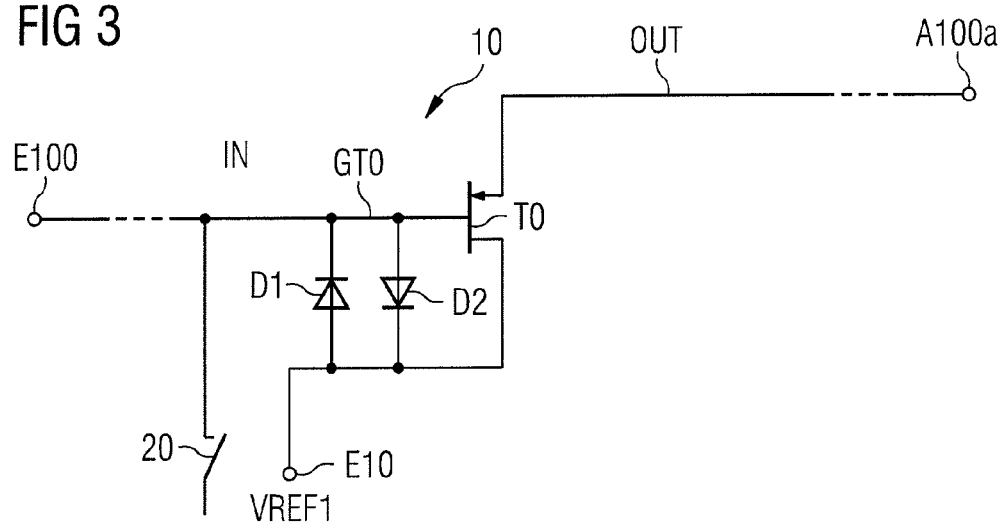
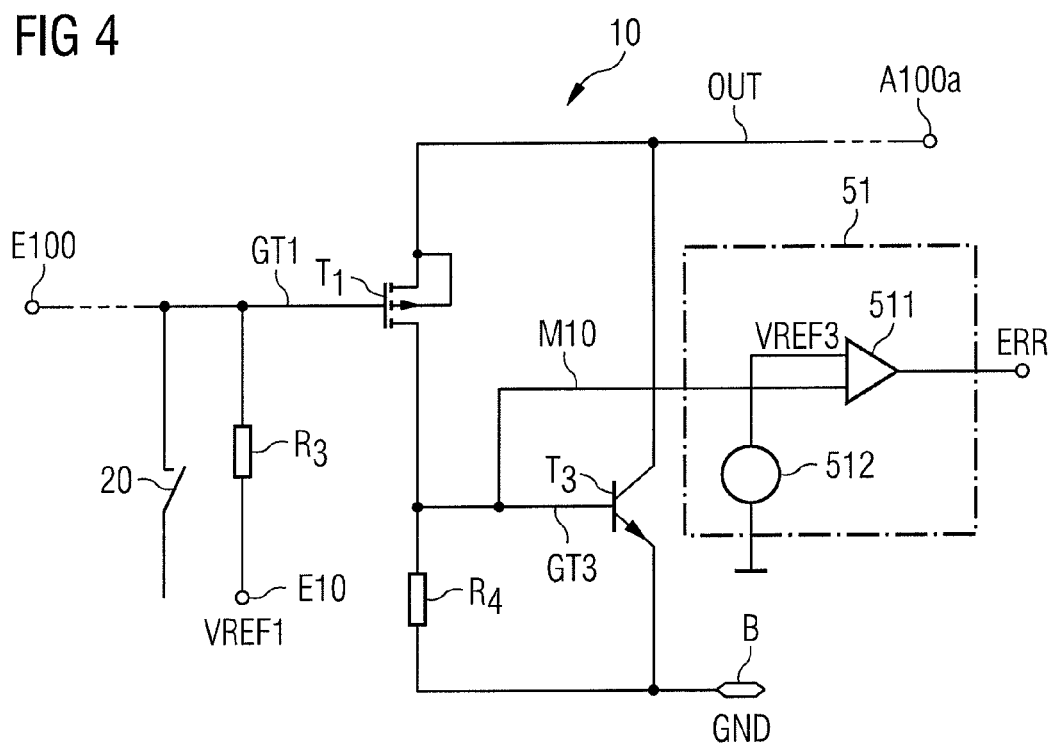

MICROPHONE AMPLIFIER

RELATED APPLICATIONS

This application claims the priority of German application no. 10 2010 054 895.2 filed Dec. 17, 2010, the entire content of which is hereby incorporated by reference.

FIELD OF THE INVENTION

The invention relates to a microphone amplifier that can be used, in particular, for amplifying signals of a MEMS microphone. The invention also relates to a circuit arrangement for converting voice signals into electrical signals. The invention furthermore relates to a method for operating a microphone amplifier, particularly a microphone amplifier that is coupled to a MEMS (micro-electromechanical system) microphone.

BACKGROUND OF THE INVENTION

The output signals of microphones are usually amplified by an amplifying circuit before they are forwarded, for example, to an analog/digital converter or other downstream amplifying units. In the widely used two-wire ECM (electret condenser microphone) microphones, the microphone features an output terminal for outputting a voice signal and a reference voltage terminal for applying a reference voltage. The output terminal is generally connected to a voltage source and downstream signal processing circuits such as, for example, amplifying circuits or analog/digital converters via a coaxial cable. Since ECM microphones merely feature two terminals, microphones of this type are used, for example, in connection with headsets, wherein a shielded wire (coaxial cable) can be used for transmitting the voice signals.

In addition to ECM microphones, MEMS microphones are also used. Three terminals are generally provided on the housing of a MEMS microphone. One terminal is provided for applying a supply voltage, another terminal is provided for contacting a reference voltage, and another terminal is provided for outputting the output signal. In contrast to ECM microphones, MEMS microphones therefore feature an additional terminal, namely the terminal for applying the supply voltage.

The external supply voltage is respectively used for operating other amplifying circuits integrated into the microphone and for generating a bias voltage for the microphone membrane of the MEMS microphone. This bias voltage is generally slightly higher than the voltage at the output terminal of the MEMS microphone. In order to operate the MEMS microphone, the terminal for applying the supply voltage therefore is usually connected to an external supply voltage source.

Due to the fact that these microphones feature, in comparison with an ECM microphone, an additional terminal for applying the supply voltage, the use of MEMS microphones is frequently associated with a higher wiring complexity, higher production costs, and the use of a larger portion of the chip surface. In addition, an exchange between the different types of microphones is generally complicated or in the most instances impossible due to the lacking compatibility with respect to the terminals.

SUMMARY OF THE INVENTION

One object of the invention is to provide a microphone amplifier, in which a supply voltage and an output signal can be made available at a common terminal. Another object of the present invention is to provide a circuit arrangement for converting voice signals into electrical signals, in which a microphone amplifier features a common terminal for making available a supply voltage and an output signal. Another object of the invention is to provide a method for operating a microphone amplifier, in which a supply voltage and an output signal are made available at a common terminal.

An embodiment of a microphone amplifier comprises an input terminal for applying an input signal, an output terminal for outputting an output signal, and an additional output terminal for outputting an additional output signal. The microphone amplifier furthermore comprises an amplifying circuit for generating the output signal by amplifying the input signal, wherein the amplifying circuit is connected between the input terminal and the output terminal. The microphone amplifier also features a voltage generator that serves for generating the additional output signal and features a supply voltage terminal for applying a supply voltage. The supply voltage terminal of the voltage generator is connected to the output terminal of the microphone amplifier.

The microphone amplifier does not require a separate terminal for applying an external supply voltage. Instead, an external voltage source is connected to the output terminal via a resistor. The external supply voltage source therefore generates a direct current for operating the microphone amplifier. The amplifying circuit generates the output signal with a corresponding level. Consequently, a useful signal and a supply voltage for operating the voltage generator are made available at the output terminal of the microphone amplifier in the modulation mode.

The microphone amplifier also comprises a controllable switch that can be operated in a first and a second state. In the first state, a terminal for applying a reference signal is connected to the input terminal. In the second state of the controllable switch, the terminal for applying the reference signal is separated from the input terminal. The controllable switch is switched into the first or the second state by a control circuit. When the amplifying circuit operates in the normal operating mode, it modulates the output voltage in such a way that at least a sufficiently high level suitable for the voltage supply of the voltage generator is always present. If the control circuit determines that an operating point of the amplifying circuit lies outside a normal operating range, the controllable switch is switched from the second state into the first state. The amplifying circuit is realized in such a way that it is once again reset to the normal operating mode when the reference signal is applied to the input terminal.

An embodiment of a circuit arrangement for converting a voice signal into an electrical signal is described below. The circuit arrangement comprises a microphone amplifier according to the above-described embodiment and a microphone. The microphone is connected between the input terminal and the additional output terminal of the microphone amplifier. The output terminal of the microphone amplifier is connected to a supply voltage source.

A method for operating a microphone amplifier is also described below. An amplifying circuit with an input terminal for applying an input signal and an output terminal for outputting an output signal is made available for operating the microphone amplifier. The amplifying circuit generates the output signal with a level that lies within a level range of the output signal in a normal operating mode, wherein the amplifying circuit generates the output signal with a level that lies outside the level range of the output signal in an abnormal operating mode. A supply voltage is applied to the output terminal of the amplifying circuit. The input signal is applied to the input terminal of the amplifying circuit. In the normal operating mode, the amplifying circuit is operated in such a way that the amplifying circuit generates the output signal with a level that lies within the level range of the output signal when the input signal is applied to the input terminal with a level that lies within a level range of the input signal, wherein the amplifying circuit is in an abnormal operating mode operated in such a way that the amplifying circuit generates the output signal at the output terminal with a level that lies outside the level range of the output signal when the input signal is applied to the input terminal with a level that lies outside the level range of the input signal. When the amplifying circuit operates in an abnormal operating mode, a reference voltage is applied to the input terminal such that the amplifying circuit is reset into the normal operating mode.

BRIEF DESCRIPTION OF THE DRAWINGS

The invention is described in greater detail below with reference to the drawings that show exemplary embodiments of the present invention.

FIG. 3 shows an embodiment of an amplifying circuit for a microphone amplifier;

FIG. 4 shows another embodiment of an amplifying circuit for a microphone amplifier;

DETAILED DESCRIPTION OF THE DRAWINGS

Figure 1:
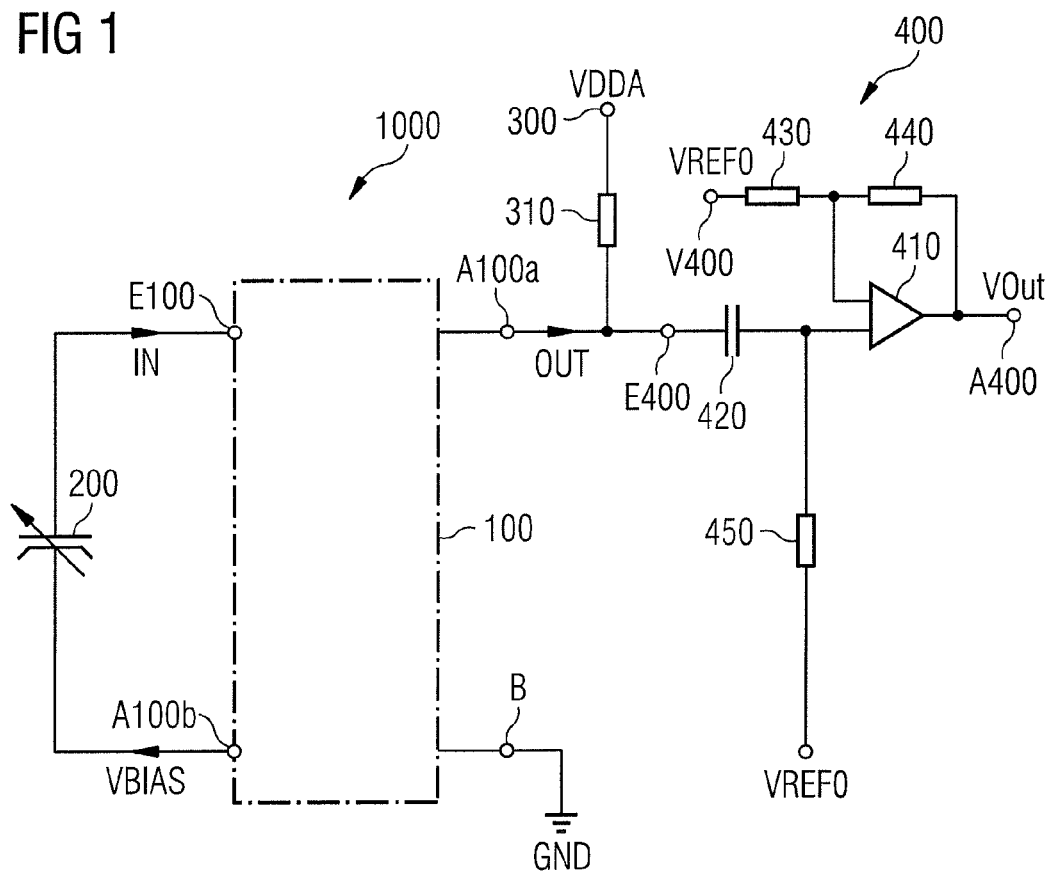
FIG. 1 shows an embodiment of a circuit arrangement for amplifying signals of a microphone.

FIG. 1 shows a circuit arrangement 1000 for processing signals IN of a microphone 200. A microphone amplifier 100 is provided in order to amplify the signals IN made available by the microphone 200 on the output side, wherein said microphone amplifier comprises an output terminal A100a for outputting an output signal OUT. The output signal may correspond to an amplified voice signal. The amplification of the microphone amplifier may also lie around the value 1 such that an impedance transformation between the microphone and the output of the microphone amplifier is achieved. The microphone amplifier also features a reference voltage terminal B for applying a reference voltage, an input terminal E100, and an additional output terminal A100b.

The microphone 200 may be realized, for example, in the form of a MEMS microphone and is connected between the input terminal E100 and the additional output terminal A100b. The microphone amplifier 100 is realized in such a way that it makes available an output signal VBIAS such as, for example, a bias voltage for a membrane of the microphone at the output terminal A100b. The input signal IN made available by the microphone is fed to the microphone amplifier 100 at the input terminal E100 and output in the form of amplified output signals OUT at the output terminal A100a.

The output terminal A100a is connected to other circuit components for processing the amplified output signals. In the exemplary embodiment according to FIG. 1, an amplifying circuit 400 is connected to the output terminal A100a. The amplifying circuit 400 comprises an amplifier 410, to an input terminal of which the output signal OUT of the microphone amplifier is fed via a capacitor 420. An additional terminal V400 of the amplifier 410 is connected to a reference voltage VREF0 via a resistor 430. An output terminal A400 of the amplifier 410 is coupled back to an input terminal of the amplifier 410 via an additional resistor 440. Another input terminal of the amplifier 410 that receives the output signal of the microphone amplifier is connected to the reference voltage VREF0 via another resistor 450. The amplifier 410 generates the output signal VOUT on the output side.

The microphone amplifier according to FIG. 1 does not feature a terminal that is specifically provided for applying a supply voltage. Instead, a voltage source 300 for making available a supply voltage VDDA is connected to the output terminal A100a of the microphone amplifier via a resistor 310. In the embodiment of the microphone amplifier illustrated in FIG. 1, the output of the amplified voice output signal, as well as the supply of the microphone amplifier with the supply voltage, are realized with the same terminal A100a.

Figure 2:
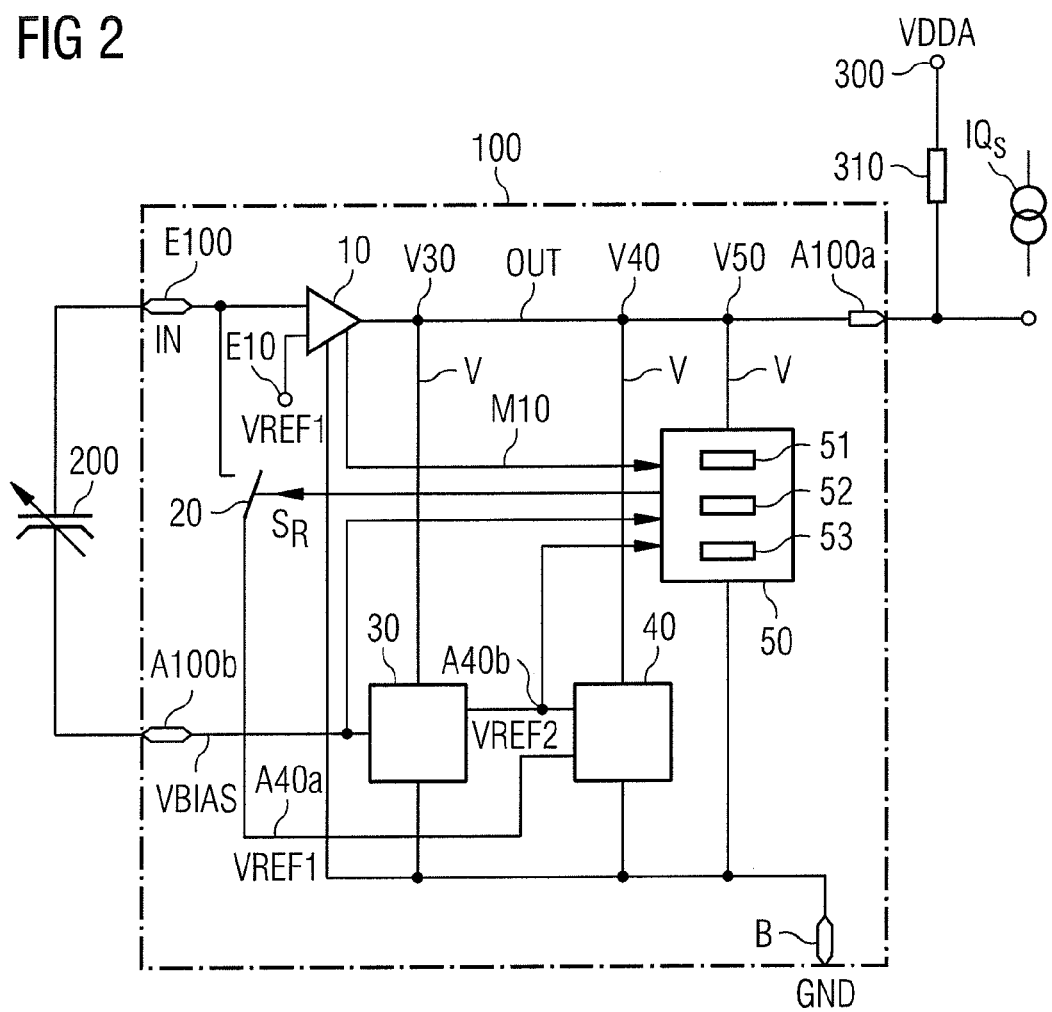
FIG. 2 shows an embodiment of a microphone amplifier for amplifying output signals of a microphone.

FIG. 2 shows a more detailed representation of an embodiment of the microphone amplifier 100. The microphone amplifier comprises an amplifying circuit 10 that is connected between an input terminal E100 of the microphone amplifier that serves for applying an input signal IN and an output terminal A100a of the microphone amplifier that serves for outputting an output signal OUT. Since the input side of the amplifying circuit is connected to the input terminal E100, the input terminal E100 of the microphone amplifier also forms an input terminal of the amplifying circuit. Likewise, the output terminal A100a of the microphone amplifier also represents an output terminal of the amplifying circuit 10 because the amplifying circuit 10 is connected to the microphone amplifier on the output side.

The input signal IN may, for example, consist of a signal made available by a microphone such as, for example, a MEMS microphone that is connected to the input terminal E100. The amplifying circuit 10 amplifies the input signal IN and generates the output signal OUT at the output terminal A100a. In addition, a reference signal VREF1 can be applied to the input terminal E100 of the amplifying circuit by means of a controllable switch 20. The reference signal VREF1 can also be fed to another input terminal E10 of the amplifying circuit.

The microphone amplifier also features a voltage generator 30 that makes available an additional output signal VBIAS at an output terminal A100b of the microphone amplifier. The additional output signal may consist, for example, of a voltage that is used as bias voltage for the membrane of the microphone connected to the microphone amplifier. The microphone amplifier furthermore comprises a voltage/current generator 40 for generating the reference signal VREF1. The reference signal VREF1 is generated at an output terminal A40a of the voltage/current generator 40 and can be fed to the input terminal E100 of the microphone amplifier by means of the controllable switch 20. The output side of the voltage/current generator 40 therefore can be connected to the input terminal E100 of the amplifying circuit 10 by means of the controllable switch. The voltage/current generator 40 also makes available a reference signal VREF2 for the voltage generator 30 at another output terminal A40b of the voltage/current generator. The reference signal VREF2 serves as a reference voltage for the voltage generator 30 in order to generate the level of the output signal VBIAS.

In order to operate the voltage generator 30 and the voltage/current generator 40, a supply voltage terminal V30 is provided on the voltage generator 30, and a supply voltage terminal V40 is provided on the voltage/current generator 40 in order to respectively apply a supply voltage V. In the embodiment of the microphone amplifier illustrated in FIG. 2, the supply voltage terminals V30 and V40 are not connected by means of a separate terminal on the housing of the microphone amplifier that is specifically provided for applying an external supply voltage. Instead, the supply voltage terminals V30 and V40 are connected to the output terminal A100a of the amplifying circuit 10 or the microphone amplifier 100, respectively. The supply voltage for the voltage generator 30 and the current/voltage generator 40 therefore is defined by the amplifying circuit 10. The level of the supply voltage V results from the reference voltage VREF1 and the voltage offset between the input terminal E100 and the output terminal A100a. The required supply current is made available by a direct voltage source 300 for generating the direct supply voltage VDDA and a resistor 310. For this purpose, the supply voltage source 300 is connected to the output terminal A100a of the amplifying circuit 10 via the resistor 310. Alternatively, the supply voltage source may also be connected to the output terminal A100a via a current source $IQ_S$ rather than the resistor 310.

The voltage generator 30 makes available an output signal VBIAS in order to operate the microphone connected between the input terminal E100 and the output terminal A100b, wherein said output signal is made available for generating the bias voltage of the microphone membrane of a MEMS microphone when such a MEMS microphone is connected to the microphone amplifier. At the input terminal E100, the microphone delivers the input signal IN that is fed to the input side of the amplifying circuit 10. After an amplification of the signal IN, the amplifying circuit 10 generates the amplified output signal OUT at the output terminal A100a. Furthermore, the amplifying circuit 10 defines the supply voltage V for the voltage generator 30 and the voltage/current generator 40 in connection with the supply voltage VDDA fed to the output terminal A100a.

The voltage generator 30 requires an adequate supply voltage suppression in order to prevent undesirable feedback loops in the overall system. The microphone produces a direct coupling between the output signal VBIAS and the input signal IN. A voltage fluctuation at the input terminal E100 is amplified by the amplifying circuit 10 and modulated on the output signal OUT. The voltage fluctuation is also fed to the voltage generator 30 via the supply voltage terminal. The voltage generator 30 is realized in such a way that this fluctuation is not significantly passed on to the output signal VBIAS. The amplification in this loop needs to lie below 1 in order to allow a stable operation.

In the normal operating state, the amplifying circuit 10 generates the output signal OUT with a level that lies within a useful voltage range of the supply voltage V required for operating the voltage generator 30, particularly for generating the output signal VBIAS with a nominal level. The nominal level of the output signal VBIAS may be a level that is required for generating the bias voltage of the microphone. In the normal operating mode, the amplifying circuit 10 also generates the output signal OUT with a level that lies within a useful voltage range of the supply voltage V required for operating the voltage/current generator 40, particularly for generating the reference signal VREF2 with a nominal level. The nominal level of the reference signal VREF2 may be a level that is required for generating the output signal VBIAS.

The voltage/current generator 40 may also generate two different reference signals, namely a reference signal VREF1 that is fed to the input E10 of the amplifier 10, as well as to the controllable switch 20, and a reference signal VREF2 that is fed to the voltage generator 30 in order to generate the output signal VBIAS.

If a signal with high signal amplitude appears at the input terminal E100, the amplifier 10 is operated beyond its normal operating mode. Such a disruptive incident may occur, for example, if the membrane of the microphone is subjected to a high noise level. One example in this respect is an explosion, the acoustic pressure of which acts upon the membrane of the microphone.

If the amplifying circuit 10 is not operated in the normal operating mode as a result of the disruptive incident, the output signal OUT can be generated at the output terminal A100a with a level that is inadequate for respectively supplying the voltage generator 30 and the voltage/current generator 40 with a sufficiently high supply voltage. Alternatively, it is possible to generate a level that is excessively high for a correct operation of the amplifier. Due to the drop of the output voltage OUT during such a disruptive incident, the voltage generator 30 generates the output signal VBIAS with an inadequate level such as, for example, a level that lies below a minimum level required for generating a bias voltage of the microphone membrane.

Likewise, the voltage/current generator 40 may also be affected by the inadequate output voltage at the output terminal A100a and generate the reference signal VREF2 with an inadequate level due to the drop of the direct voltage level of the output signal OUT such that the voltage generator 30 generates the output signal VBIAS with an inadequate level.

The low level of the output signal VBIAS at the output terminal A100b causes the level of the bias voltage for the microphone membrane to be lowered. This in turn causes the level of the input signal IN made available by the microphone at the input terminal E100 to drop such that the output voltage of the amplifying circuit 10 and the supply voltage V also drop. If the supply voltage V drops so far that it lies outside the voltage range required for the respective supply of the voltage generator 30 and the voltage/current generator 40, a disruptive incident occurs that renders the microphone inoperable. Due to the high-time constant between the second range and the minute range at the input of the amplifying circuit 10, the functional failure of the microphone may last for quite some time, wherein this is no longer acceptable in most applications.

In order to quickly detect a disruptive incident and to restore the functional integrity of the microphone amplifier as quickly as possible in order to prevent a sustained failure of the microphone of several seconds, the microphone amplifier 100 features a control circuit 50 for switching the controllable switch into a first and a second state. For this purpose, the control circuit generates the control signal $S_R$.

The controllable switch 20 can be switched into the first or the second state by means of the control signal $S_R$. In the first state, the controllable switch operates, for example, in a conductive or low-resistance fashion and produces a low-resistance connection between the output terminal A40a of the voltage/current generator 40 and the input terminal E100 of the microphone amplifier. In the second state of the controllable switch 20, it operates in a non-conductive or high-resistance fashion such that the output terminal A40a of the voltage/current generator 40 is separated from the input terminal E100 of the microphone amplifier or connected thereto in a high-resistance fashion, respectively.

The amplifying circuit 10 is realized in such a way that it is reset from an abnormal operating state into the normal operating state when the reference signal VREF1 is fed to the input terminal E100 and the reference signal has a nominal level. The nominal level of the reference signal VREF1 is generated by the voltage/current generator 40 when the amplifying circuit 10 makes available a sufficiently high level of the output signal OUT that can be used for the voltage supply of the voltage/current generator 40 at the output terminal A100a in the normal operating mode. The control circuit 50 is designed for switching the controllable switch 20 from the second state into the first state when the control circuit 50 determines that the amplifying circuit 10 is operated in an abnormal operating state.

The control circuit 50 may be designed, for example, for monitoring the position of an operating point of the amplifying circuit 10. The position of the operating point of the amplifying circuit 10 can be monitored, for example, by determining a voltage M10 that characterizes the operating point. In order to establish the operating point of the amplifying circuit, a monitoring signal M10 from the amplifying circuit 10 is fed to the input side of the control circuit 50.

The monitoring signal M10 characterizes the position of the operating point of the amplifying circuit 10. The control circuit 50 may feature a monitoring circuit 51 that evaluates the monitoring signal M10. For example, a voltage that characterizes the operating point is compared with a nominal level of the voltage.

The control circuit 50 switches the controllable switch 20 from the second state into the first state by means of the control signal $S_R$ when the monitoring circuit 51 determines that the operating point of the amplifying circuit 10 lies outside the normal operating range of the amplifying circuit, i.e., outside the range in which the amplifying circuit 10 generates the output signal OUT with a level that lies in the useful voltage range in order to respectively supply the voltage generator 30 and the voltage/current generator 40 with a sufficiently high supply voltage for respectively generating the output signal VBIAS and the reference signals VREF1, VREF2.

In addition whether enough current is flowing to amplifying circuit 10 through resistor 310 in order to ensure the correct operation of amplifying circuit 10 is monitored.

Additionally or alternatively to monitoring the position of the operating point of the amplifying circuit, the control circuit 50 can also be used for monitoring the level of the reference signal VREF2 made available by the voltage/current generator 40. For this purpose, the level of the reference signal VREF2 can be fed to the input side of the control circuit 50 by connecting the control circuit 50 to the output terminal A40a of the voltage/current generator 40. In this embodiment, the control circuit 50 may feature a monitoring circuit 52 that evaluates the level of the reference signal VREF2. When the monitoring circuit 52 determines that the level of the reference signal VREF2 lies above or below a nominal level of the reference signal, the control circuit 50 generates the control signal $S_R$ such that the controllable switch 20 is switched from the second state into the first state.

Additionally or alternatively to monitoring the position of the operating point of the amplifying circuit or the level of the reference signal VREF2, the output signal VBIAS generated by the voltage generator 30 on the output side may, according to another embodiment, be fed to the control circuit 50. The control circuit 50 features a monitoring circuit 53 for monitoring the level of the output signal VBIAS. When the monitoring circuit 53 determines that the level of the output signal VBIAS rises above a nominal level or drops below a nominal level, the control circuit 50 generates the control signal $S_R$ for switching the controllable switch 20 from the second state into the first state.

Since the controllable switch 20 is respectively controlled in a conductive or low-resistance fashion, the reference signal VREF1 is fed to the input terminal E100 of the amplifying circuit 10. The input terminal E100 of the amplifying circuit connected to the microphone has a high impedance, for example, an impedance in the range between a few hundred ohm and several teraohm. The impedance may lie, for example, between 500Ω and 100 TΩ. The reference signal VREF1 causes the input signal at the input terminal E100 to have a mean input value. In the normal operating mode of the amplifying circuit, the reference signal VREF1 is connected to the input terminal E100 via a high-resistance path. The high-resistance path may be formed, for example, by two diodes that are connected antiparallel.

The high-resistance path, via which the reference signal VREF1 is applied to the amplifying circuit, results in a high time constant and therefore a long time period of several seconds until the input terminal E100 is charged to the level of the reference signal VREF1. When the controllable switch 20 is controlled in a conductive fashion, the high-resistance path, on which the reference signal is made available in the normal operating mode of the amplifier, is bypassed in a low-resistance fashion or short-circuited, respectively. This makes it possible to feed the reference signal generated by the voltage/current generator 40 to the input terminal E100 in a low-resistance fashion. If the controllable switch has been controlled in a conductive fashion because the amplifying circuit operated outside the normal operating state and therefore in an abnormal mode, the amplifying circuit 10 is very quickly reset from the abnormal operating state into the normal operating state.

After the amplifying circuit 10 has once again been switched into the normal operating state, the output signal OUT once again appears at the output of the amplifying circuit 10 with a sufficiently high direct voltage level for also ensuring the normal operation of the voltage generator 30, as well as the voltage/current generator 40. In the normal operating mode of the voltage generator 30, the voltage generator 30 generates the output signal VBIAS with a sufficiently high level for ensuring the functionality of the microphone 200. In the normal operating mode of the voltage/current generator 40, the reference signals VREF1, VREF2 are also generated with a level required for the proper functionality of the voltage generator 30 and the amplifying circuit 10.

Due to the circuit of a microphone amplifier illustrated in FIG. 2, the supply voltage for the voltage generator 30, as well as for the voltage/current generator 40, can be made available at the output terminal A100a of the amplifying circuit 10. An additional terminal for respectively making available an external supply voltage for the voltage generator 30 and the voltage/current generator 40 is not required. The amplifying circuit is realized in such a way that the level of the output signal OUT at the output terminal A100 also is still sufficiently high for its use as a supply voltage for the control circuit 50 when the amplifying circuit operates in an abnormal operating mode.

The microphone amplifier 100 makes it possible to easily exchange an ECM microphone with a MEMS microphone without having to increase the wiring complexity. This is of particular interest in headset applications. In addition, valuable chip surface can be saved due to the elimination of a separate terminal for respectively applying an external supply voltage for the voltage generator 30 and for the voltage/current generator 40.

FIG. 3 shows an embodiment of the amplifying circuit 10. The input terminal E100 of the amplifying circuit is connected to the gate terminal GT0 of a transistor T0. The source terminal of the transistor, at which the output signal OUT is generated, is connected to the output terminal A100a of the microphone amplifier. The reference signal VREF1, such as, for example, a reference voltage applied to the input terminal E10, is fed to the drain terminal of the transistor T0.

In the normal operating mode of the circuit, the reference signal VREF1 is applied to the input terminal E100 via a high-resistance path formed by the diodes D1 and D2 that are connected antiparallel. If a disruptive incident occurs that results in a drop of the output voltage OUT of the amplifying circuit, the controllable switch 20 is controlled in a conductive fashion such that the two antiparallel diodes D1 and D2 are bypassed in a low-resistance fashion. This causes the input terminal E100 to be connected to the terminal A40a in a low-resistance fashion. The amplifying circuit is reset into the normal operating mode due to the low-resistance coupling of the reference voltage VREF1 into the input terminal E100.

FIG. 4 shows another embodiment of the amplifying circuit 10. In the exemplary embodiment illustrated in FIG. 4, the amplifying circuit is realized in the form of a super-source-sequential circuit. The input terminal E100 for applying the input signal IN is connected to a control terminal GT1 of a transistor $T_1$ such as, for example, a MOSFET transistor. The reference signal VREF1 applied to the input terminal E10 is connected in a high-resistance fashion to the input terminal E100 via a resistor $R_3$. The source terminal of the transistor $T_1$ is connected to the output terminal A100a of the amplifying circuit. A feedback is realized by means of another resistor $R_4$, as well as a transistor $T_3$, in order to generate a constant current over the source-drain path of the transistor $T_1$. For this purpose, the transistor $T_1$ is connected to a terminal B for applying a reference voltage GND such as, for example, a ground potential via the resistor $R_4$. The transistor $T_3$ may be realized, for example, in the form of a bipolar transistor and is connected between the output terminal A100a and the terminal B parallel to the transistor $T_1$ and the resistor $R_4$. A control terminal GT3 of the transistor $T_3$ is connected between the transistor $T_1$ and the resistor $R_4$.

FIG. 4 also shows an embodiment of the monitoring circuit 51. The monitoring circuit 51 features a comparator 511 and an additional reference voltage source 512 for generating a reference voltage VREF3. The comparator 511 monitors the operating point M10 of the circuit 10. If an excessively high input signal causes an excessively positive output of the amplifier, the current in the transistor $T_1$ is reduced to such a degree that the transistor $T_3$ is no longer conductive and the voltage drops below VREF3 at the resistor $R_4$. This results in an error signal ERR being generated and forwarded to the control circuit 50.

The super-source-sequential circuit illustrated in FIG. 4 allows an amplification of about 1 that is nearly independent of the load at the output terminal A100a due to the current path of the transistor $T_3$ that is connected parallel to the current path of the transistor $T_1$.

Figure 5:
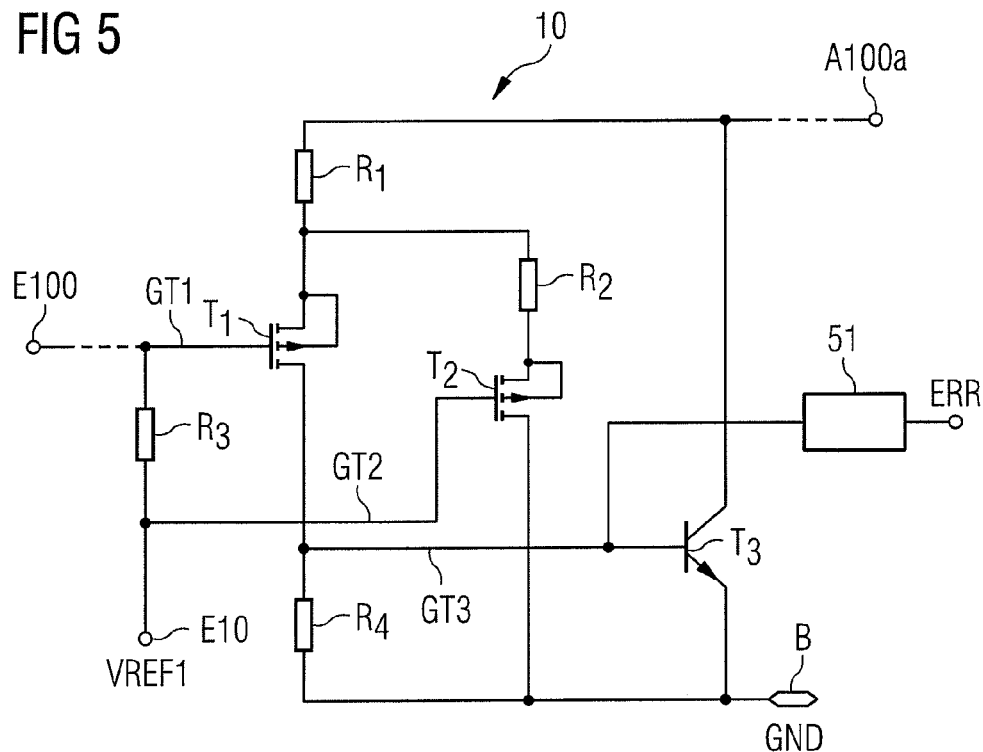
FIG. 5 shows another embodiment of an amplifying circuit for a microphone amplifier.

FIG. 5 shows another embodiment of the amplifying circuit 10 for amplifying the input signal IN that is connected to the monitoring circuit 51 described above with reference to FIG. 4. The output terminal A100a of the amplifying circuit 10 is connected to a current path 1 via a resistor $R_1$. A voltage-controlled current source $T_1$ is provided in the current path 1. The voltage-controlled current source $T_1$ may be realized in the form of a transistor such as, for example, a MOSFET transistor. A resistor $R_4$ is also connected to the current path 1 in series with the voltage-controlled current source $T_1$. The current path 1 or the voltage-controlled current source $T_1$ and the resistor $R_4$ therefore is/are respectively connected between the resistor $R_1$ and a reference voltage terminal B for applying a reference voltage GND such as, for example, a ground potential.

The embodiment of the amplifying circuit 10 illustrated in FIG. 5 also features a current path 2 that comprises a voltage-controlled current source $T_2$. A resistor $R_2$ is connected in series with the current path 2 or the voltage-controlled current source $T_2$, respectively. The series circuit consisting of the resistor $R_2$ and the current path 2 or the voltage-controlled current source $T_2$, respectively, is connected parallel to the current path 1.

The amplifying circuit 10 also features a current path 3 that comprises a voltage-controlled current source $T_3$. The current path 3 and therefore the voltage-controlled current source $T_3$ are connected between the output terminal A100a and the reference voltage terminal B parallel to the series circuit of the resistor $R_1$ and the current path 1.

A control terminal GT1 of the voltage-controlled current source $T_1$ is connected to the input terminal E100 for applying the input signal IN. The voltage-controlled current source $T_2$ features a control terminal GT2 that is connected to the input terminal E2 for applying the reference signal VREF1. A control terminal GT3 of the voltage-controlled current source $T_3$ is connected to the current path 1 between the voltage-controlled current source $T_1$ and the resistor $R_4$.

Due to the coupling of the direct reference voltage VREF1 into the input terminal E10, a direct voltage level is defined at the input terminal E100 because the input terminals E100 and E10 are coupled via the resistor $R_3$. The arrangement of the resistor $R_3$ between the input terminal E100 and the input terminal E10 of the amplifying circuit 10 is optional. If a signal source that generates a direct voltage level is connected to the input terminal E100, the resistor $R_3$ can be eliminated, and the input terminals E100 and E10 may be decoupled from one another.

In order to make available a supply voltage for the amplifying circuit 10, a supply voltage source may be connected to the output terminal A100a of the amplifying circuit via a resistor. When the input signal IN is fed to the control terminal GT1 of the transistor $T_1$, the output signal OUT is generated at the output terminal A100a after an amplification of the input signal IN. The feedback realized with the transistor $T_3$ and the resistor $R_4$ leads to a reduction of the output impedance of the amplifying circuit such that the amplification of the circuit arrangement 10 according to FIG. 5 becomes nearly load-independent.

An amplification can be produced due to the connection of the current path 2 parallel to the current path 1. The transistor $T_1$ forms the first amplification stage together with the resistor $R_4$. The amplification of this stage results from A=gm(T1)×$R_4$, wherein gm(T1) designates the transconductance of the transistor $T_1$. A second amplification stage is formed by the transistor $T_3$ and the load at the output terminal A100a. The amplification of the entire circuit arrangement 10 according to FIG. 5 can be adjusted with the aid of the resistors $R_1$ and $R_2$.

Figure 6:
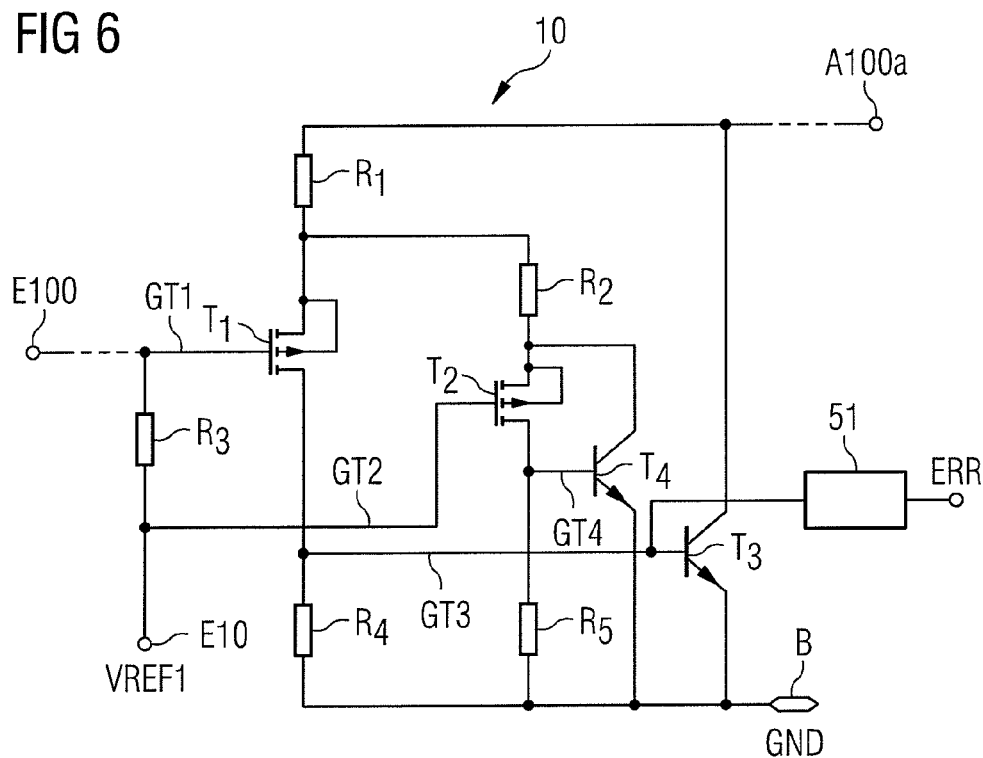
FIG. 6 shows another embodiment of an amplifying circuit for a microphone amplifier.

FIG. 6 shows another embodiment of the amplifying circuit 10 for amplifying voice signals of a microphone that is connected to the monitoring circuit 51 described above with reference to FIG. 4. Identical circuit elements in FIGS. 5 and 6 are identified by the same reference symbols.

In comparison with the circuit arrangement 10 according to FIG. 5, the circuit arrangement 10 according to FIG. 6 features an additional current path 4. The current path 4 contains a voltage-controlled current source $T_4$ that may be realized, for example, in the form of a transistor. A resistor $R_5$ connected to the reference voltage terminal B is arranged in the current path 2 in series with the voltage-controlled current source $T_2$. The transistor $T_4$ is connected parallel to the current path 2. A control terminal GT4 of the transistor $T_4$ is connected to the current path 2 between the transistor $T_2$ and the resistor $R_5$. Due to the addition of the current path 4 and the resistor $R_5$, the influence of the transconductance $gm_{T2}$ of the transistor $T_2$ on the amplification A of the amplifying circuit is reduced. The impedance at the source terminal of $T_2$ becomes very low due to the feedback formed by the transistor $T_4$ and the resistor $R_5$.

The amplifying circuits according to FIGS. 5 and 6 may be used as two-wire analog interfaces, in which the voltage supply and the useful signal are made available at the output terminal A100a via a common line in the modulation mode. Consequently, the amplifying circuit can be used, in particular, for amplifying voice output signals of ECM microphones or MEMS microphones. The amplification A of the amplifying circuit can be adjusted by scaling the resistors $R_1$ and $R_2$ accordingly.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A microphone amplifier, comprising:
    an input terminal for applying an input signal;
    an output terminal for outputting an output signal;
    an additional output terminal for outputting an additional output signal;
    an amplifying circuit for generating the output signal by amplifying the input signal, wherein the amplifying circuit is connected between the input terminal and the output terminal;
    a voltage generator that serves for generating the additional output signal and features a supply voltage terminal for inputting a supply voltage to operate the voltage generator to generate the additional output signal; and
    a controllable switch configured to be switched into a first and a second state,
    wherein the controllable switch is configured to connect the input terminal to a terminal for applying a reference signal in the first state of the controllable switch and to separate the input terminal from the terminal for applying the reference signal in the second state of the controllable switch,
    wherein the supply voltage terminal of the voltage generator is connected to the output terminal of the microphone amplifier~
    wherein the amplifying circuit has a first input terminal connected to the controllable switch to apply the reference signal to the first input terminal and a second input terminal to apply the reference signal.

2. The microphone amplifier according to claim 1,
    wherein the amplifying circuit is realized in such a way that the amplifying circuit generates the output signal with a level that lies within a voltage range of the supply voltage of the voltage generator in a normal operating state and generates the output signal with a level that lies outside the voltage range of the supply voltage of the voltage generator in an abnormal operating state, wherein the voltage range is required for generating the additional output signal with a nominal level by means of the voltage generator, and
    wherein the amplifying circuit is realized in such a way that the amplifying circuit is reset from an abnormal operating state into the normal operating state when the reference signal is fed to the input terminal and the reference signal has the nominal level.

3. The microphone amplifier according to claim 2, comprising:
    a control circuit for controlling the first and the second state of the controllable switch; and
    wherein the control circuit is realized in such a way that the control circuit switches the controllable switch from the second state into the first state when the control circuit determines that the amplifying circuit is operated in an abnormal operating state.

4. The microphone amplifier according to claim 3,
    wherein the control circuit is designed for determining a position of the operating point of the amplifying circuit, and
    wherein the control circuit switches the controllable switch from the second state into the first state when the control circuit determines that the operating point of the amplifying circuit lies outside the normal operating range of the amplifying circuit.

5. The microphone amplifier according to claim 3, comprising:
    an additional voltage generator for generating the reference signal and an additional reference signal,
    wherein the additional voltage generator features a supply voltage terminal for inputting the supply voltage to operate the additional voltage generator to generate the reference signal and the additional reference signal,
    wherein the supply voltage terminal of the additional voltage generator is connected to the output terminal of the microphone amplifier,
    wherein the additional reference signal is fed to the voltage generator, and
    wherein the voltage generator is realized in such a way that the voltage generator generates the additional output signal with a level required for operating a microphone connected to the additional output terminal when the additional voltage generator generates the additional reference signal with a level that lies within a nominal level range of the additional reference signal.

6. The microphone amplifier according to claim 5,
    wherein the control circuit is designed for determining the level of the additional reference signal, and
    wherein the control circuit switches the controllable switch from the second state into the first state when the control circuit determines that the level of the additional reference signal lies above or below the nominal level range of the additional reference signal.

7. The microphone amplifier according to claim 6,
    wherein the control circuit is designed for determining the level of the additional output signal, and
    wherein the control circuit switches the controllable switch from the second state into the first state when the control circuit determines that the level of the additional output signal lies above or below a nominal level range of the output signal that is required for operating a microphone connected to the additional output terminal.

8. The microphone amplifier according to claim 1, wherein the terminal for applying the reference signal is connected to the input terminal via a path that has a higher resistance in the second state of the controllable switch than in the first state of the controllable switch.

9. The microphone amplifier according to claim 1, wherein the amplifying circuit is realized in the form of a source-sequential circuit.

10. A circuit arrangement for converting a voice signal into an electrical signal, comprising:
    the microphone amplifier according to claim 1; and
    a microphone, wherein the microphone is connected between the input terminal and the additional output terminal of the microphone amplifier, wherein the output terminal of the microphone amplifier is connected to a supply voltage source.

11. The circuit arrangement according to claim 10, wherein the microphone is a MEMS microphone.

12. The circuit arrangement according to claim 11, wherein the supply voltage source is connected to the output terminal via a resistor or a current source.

13. A method for operating a microphone amplifier, comprising the steps of:
  making available an amplifying circuit with an input terminal for applying an input signal and an output terminal for outputting an output signal, wherein the amplifying circuit generates the output signal with a level that lies within a level range of the output signal in a normal operating mode and generates the output signal with a level that lies outside the level range of the output signal in an abnormal operating mode;
  making available a controllable switch configured to be switched into a first and a second state;
  applying a supply voltage to the output terminal of the amplifying circuit;
  applying the input signal to the input terminal of the amplifying circuit;
  operating the amplifying circuit in such a way in the normal operating mode that the amplifying circuit generates the output signal with a level that lies within the level range of the output signal when the input signal is applied to the input terminal with a level that lies within a level range of the input signal or operating the amplifying circuit in such a way in an abnormal operating mode that the amplifying circuit generates the output signal at the output terminal with a level that lies outside the level range of the output signal when the input signal is applied to the input terminal with a level that lies outside the level range of the input signal; and
  applying a reference voltage to the input terminal when the amplifying circuit operates in an abnormal operating mode such that the amplifying circuit is reset into the normal operating mode,
  wherein the controllable switch is configured to connect the input terminal to a terminal for applying a reference signal in the first state of the controllable switch and to separate the input terminal from the terminal for applying the reference signal in the second state of the controllable switch,
  wherein the amplifying circuit has a first input terminal connected to the controllable switch to apply the reference signal to the first input terminal and a second input terminal to apply the reference signal.

14. The method according to claim 13, comprising the steps of:
  making available a voltage generator that serves for generating an additional output signal and features a supply voltage terminal for inputting a supply voltage to operate the voltage generator to generate the additional output signal;
  feeding the output signal to the supply voltage terminal of the voltage generator;
  generating the additional output signal with a nominal level when the amplifying circuit operates in the normal operating mode;
  making available an additional voltage generator for generating an additional reference voltage, wherein the additional voltage generator features a supply voltage terminal for inputting the supply voltage to operate the additional voltage generator to generate the additional reference signal;
  feeding the output signal to the supply voltage terminal of the additional voltage generator; and
  generating the additional reference voltage with the additional voltage generator, and feeding the additional reference voltage to the voltage generator in order to generate the additional output signal.

15. The method according to claim 13, comprising the steps of:
  determining an operating point of the amplifying circuit and/or the level of the additional reference voltage and/or the level of the additional output signal; and
  applying the reference voltage to the input terminal when the position of the operating point of the amplifying circuit shifts from the normal operating range of the amplifying circuit into an abnormal operating range and/or the level of the additional reference voltage lies above or below a nominal level of the additional reference voltage and/or the level of the additional output signal lies above or below a nominal level of the additional output signal.

* * * * *